(12) United States Patent
Nishioka et al.

(10) Patent No.: US 11,508,873 B2
(45) Date of Patent: Nov. 22, 2022

(54) LIGHT EMITTING DEVICE AND PROJECTOR

(71) Applicants: Seiko Epson Corporation, Tokyo (JP); Sophia School Corporation, Tokyo (JP)

(72) Inventors: Hiroki Nishioka, Kita (JP); Katsumi Kishino, Akiruno (JP)

(73) Assignees: SEIKO EPSON CORPORATION; Sophia School Corporation

( * ) Notice: Subject to any disclaimer, the term of this patent is extended or adjusted under 35 U.S.C. 154(b) by 350 days.

(21) Appl. No.: 16/829,297

(22) Filed: Mar. 25, 2020

(65) Prior Publication Data

US 2020/0313040 A1 Oct. 1, 2020

(30) Foreign Application Priority Data

Mar. 26, 2019 (JP) .............................. JP2019-059111

(51) Int. Cl.
| | |
|---|---|
| *H01L 33/08* | (2010.01) |
| *H01L 33/02* | (2010.01) |
| *H01L 33/44* | (2010.01) |
| *G03B 21/20* | (2006.01) |
| *H01S 5/185* | (2021.01) |
| *H01S 5/11* | (2021.01) |

(52) U.S. Cl.
CPC .......... *H01L 33/08* (2013.01); *G03B 21/2006* (2013.01); *H01L 33/025* (2013.01); *H01L 33/44* (2013.01); *H01S 5/11* (2021.01); *H01S 5/185* (2021.01)

(58) Field of Classification Search
CPC ....... H01L 33/08; H01L 33/025; H01L 33/44; G03B 21/2006; H01S 5/11; H01S 5/185
See application file for complete search history.

(56) References Cited

U.S. PATENT DOCUMENTS

| | | | |
|---|---|---|---|
| 8,759,814 B2 * | 6/2014 | Yang | H01L 33/18 |
| | | | 257/89 |
| 9,184,335 B2 * | 11/2015 | Hwang | H01L 33/005 |
| 9,287,443 B2 * | 3/2016 | Konsek | H01L 31/035281 |
| 9,362,717 B2 * | 6/2016 | Kikuchi | H01L 21/02458 |
| 10,153,399 B2 * | 12/2018 | Dornel | H01L 33/005 |

(Continued)

FOREIGN PATENT DOCUMENTS

| | | |
|---|---|---|
| JP | 2002-118326 A | 4/2002 |
| JP | 2007-116057 A | 5/2007 |

(Continued)

*Primary Examiner* — Eugene Lee
(74) *Attorney, Agent, or Firm* — Harness, Dickey & Pierce, P.L.C.

(57) ABSTRACT

There is provided a light emitting device including: a substrate; a laminated structure provided on the substrate and having a plurality of columnar portions, in which the columnar portion includes an n-type first semiconductor layer, a p-type second semiconductor layer, a light emitting layer provided between the first semiconductor layer and the second semiconductor layer, and a third semiconductor layer having a band gap larger than that of the light emitting layer, and the third semiconductor layer includes a first part provided between the light emitting layer and the second semiconductor layer, and a second part that is in contact with a side surface of the light emitting layer.

8 Claims, 10 Drawing Sheets

(56) References Cited

U.S. PATENT DOCUMENTS

| | | | |
|---|---|---|---|
| 10,608,411 B2* | 3/2020 | Noda | H01S 5/2031 |
| 2008/0157057 A1 | 7/2008 | Kim | |
| 2009/0169828 A1* | 7/2009 | Hersee | H01L 21/02609 |
| | | | 428/172 |
| 2014/0327037 A1 | 11/2014 | Dussaigne et al. | |
| 2016/0274031 A1* | 9/2016 | Chu | G01N 21/658 |
| 2020/0266611 A1* | 8/2020 | Nagawa | H01S 5/2018 |
| 2020/0335548 A1* | 10/2020 | Beix | H01L 33/42 |
| 2021/0408765 A1* | 12/2021 | Ishizawa | H01S 5/42 |

FOREIGN PATENT DOCUMENTS

| | | |
|---|---|---|
| JP | 2008-244302 A | 10/2008 |
| JP | 2009-170450 A | 7/2009 |
| JP | 4841628 B | 12/2011 |
| JP | 2018-029205 A | 2/2018 |

* cited by examiner

LIGHT EMITTING DEVICE AND PROJECTOR

The present application is based on, and claims priority from JP Application Serial Number 2019-059111, filed Mar. 26, 2019, the disclosure of which is hereby incorporated by reference herein in its entirety.

BACKGROUND

1. Technical Field

The present disclosure relates to a light emitting device and a projector.

2. Related Art

Semiconductor laser is expected as a next generation light source with high brightness. In particular, semiconductor laser having a nanostructure called nanocolumn, nanowire, nanorod, nanopillar, and the like is expected to be realized by a light emitting device capable of obtaining high-power light emission at a narrow radiation angle by the effect of a photonic crystal.

For example, JP-A-2008-244302 discloses a light-emitting element having a plurality of nanocolumns on a conductive substrate and having an insulating layer embedded between nanocolumns adjacent to each other. The nanocolumn has a light emitting layer made of a nitride semiconductor or an oxide semiconductor.

In the light emitting element disclosed in JP-A-2008-244302, dangling bonds are formed on side surfaces of the light emitting layer, and there is a concern that surface recombination occurs. When surface recombination occurs on the side surface of the light emitting layer, the light emission efficiency decreases.

SUMMARY

A light emitting device according to an aspect of the present disclosure includes: a substrate; a laminated structure provided on the substrate and having a plurality of columnar portions, in which the columnar portion includes an n-type first semiconductor layer, a p-type second semiconductor layer, a light emitting layer provided between the first semiconductor layer and the second semiconductor layer, and a third semiconductor layer having a band gap larger than that of the light emitting layer, and the third semiconductor layer includes a first part provided between the light emitting layer and the second semiconductor layer, and a second part that is in contact with a side surface of the light emitting layer.

In the light emitting device, the third semiconductor layer may be a p-type semiconductor layer, and an impurity concentration of the third semiconductor layer may be higher than an impurity concentration of the second semiconductor layer.

In the light emitting device, a thickness of the second part may be less than a thickness of the first part.

In one aspect of the light emitting device, the impurity concentration of the second part may be smaller than the impurity concentration of the first part.

In the light emitting device, the columnar portion may have a first guide layer and a second guide layer sandwiching the light emitting layer, the second guide layer may be provided between the light emitting layer and the second semiconductor layer, and the first part may be provided between the light emitting layer and the second guide layer.

In the light emitting device, the columnar portion may have a first guide layer and a second guide layer sandwiching the light emitting layer, the second guide layer may be provided between the light emitting layer and the second semiconductor layer, and the first part may be provided between the second guide layer and the second semiconductor layer.

In the light emitting device, the third semiconductor layer may not be in contact with the first semiconductor layer.

A projector according to another aspect of the present disclosure includes the light emitting device according to the aspect.

DESCRIPTION OF EXEMPLARY EMBODIMENTS

Hereinafter, appropriate embodiments of the present disclosure will be described in detail with reference to the drawings. The embodiments described below are not inappropriately limited to the contents of the present disclosure described in the appended claims. In addition, not all of the configurations described below are essential configuration requirements of the present disclosure.

1. First Embodiment

1.1. Light Emitting Device

Figure 1:
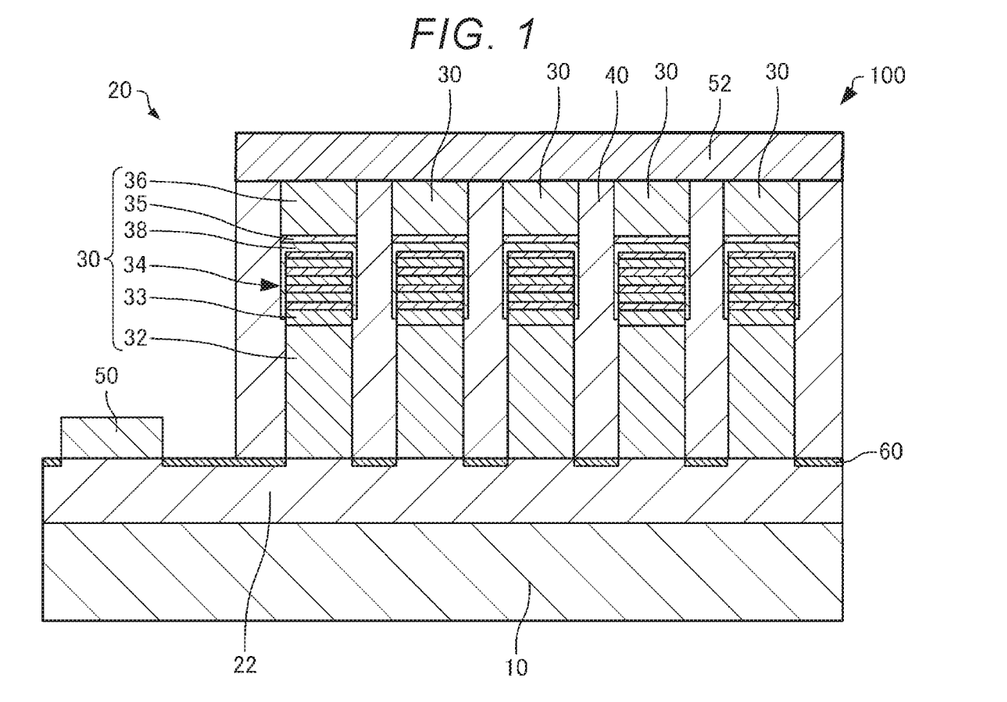
FIG. 1 is a sectional view schematically illustrating a light emitting device according to a first embodiment.
Figure 2:
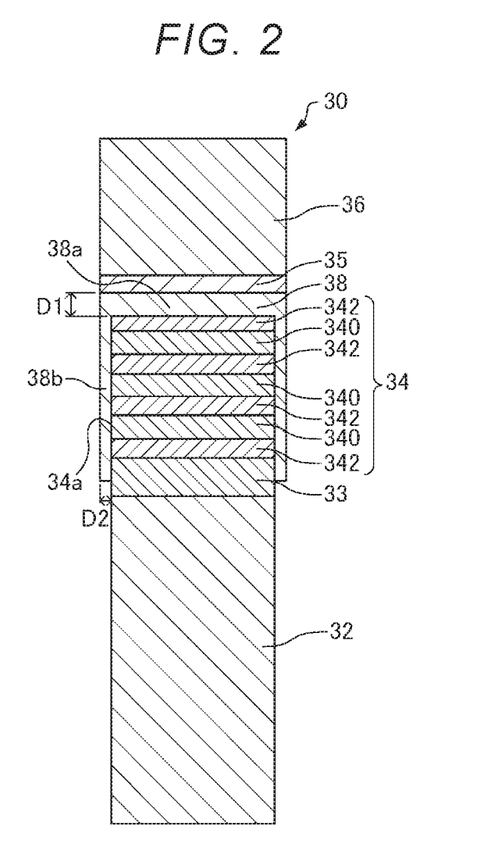
FIG. 2 is a sectional view schematically illustrating a columnar portion of the light emitting device according to the first embodiment.

First, a light emitting device according to a first embodiment will be described with reference to the drawings. FIG. 1 is a sectional view schematically illustrating a light emitting device 100 according to the first embodiment. FIG. 2 is a sectional view schematically illustrating a columnar portion 30 of the light emitting device 100 according to the first embodiment.

As illustrated in FIG. 1, the light emitting device 100 includes a substrate 10, a laminated structure 20, a first electrode 50, and a second electrode 52.

The substrate 10 has, for example, a plate shape. The substrate 10 is, for example, a Si substrate, a GaN substrate, a sapphire substrate, or the like.

The laminated structure 20 is provided on the substrate 10. In the drawings, the laminated structure 20 is provided on the substrate 10. The laminated structure 20 includes, for example, a buffer layer 22, a plurality of columnar portions 30, and a light propagation layer 40.

In addition, "upper" means a direction away from the substrate 10 when viewed from a light emitting layer 34 in a lamination direction (hereinafter, also simply referred to as "lamination direction") of the laminated structure 20, and "lower" means a direction approaching the substrate 10 when viewed from the light emitting layer 34 in the lamination direction. Further, the "lamination direction of the laminated structure 20" is a lamination direction of a first semiconductor layer 32 and the light emitting layer 34.

The buffer layer 22 is provided on the substrate 10. The buffer layer 22 is, for example, an n-type GaN layer doped with silicon. On the buffer layer 22, a mask layer 60 for forming the columnar portion 30 is provided. The mask layer 60 is, for example, a titanium layer, a titanium oxide layer, a silicon oxide layer, an aluminum oxide layer, or the like.

The columnar portion 30 is provided on the buffer layer 22. The planar shape of the columnar portion 30 viewed from the lamination direction is, for example, a polygon or a circle. A diameter of the columnar portion 30 is the order of nm, and is, for example, 10 nm or more and 500 nm or less. The columnar portion 30 is also called, for example, nanocolumns, nanowires, nanorods, and nanopillars. The size in the lamination direction of the columnar portion 30 is, for example, 0.1 μm or more and 5 μm or less.

The "diameter" is a diameter when the planar shape of the columnar portion 30 is a circle, and a diameter of the smallest inclusive circle when a planar shape of the columnar portion 30 is not a circle. For example, the diameter of the columnar portion 30 is the minimum diameter of a circle including a polygon therein when the planar shape of the columnar portion 30 is a polygon, and is the minimum diameter of the circle including an ellipse therein when the planar shape of the columnar portion 30 is an ellipse.

A plurality of columnar portions 30 are provided. The interval between the columnar portions 30 adjacent to each other is, for example, 1 nm or more and 500 nm or less. The plurality of columnar portions 30 are arranged at a predetermined pitch in a predetermined direction in a plan view when viewed from the lamination direction. The plurality of columnar portions 30 are arranged, for example, in a triangular lattice shape, a quadrangular lattice shape, or the like in a plan view when viewed from the lamination direction. The plurality of columnar portions 30 can exhibit the effect of a photonic crystal. The columnar portion 30 includes a first semiconductor layer 32, a first guide layer 33, a light emitting layer 34, a second guide layer 35, a second semiconductor layer 36, and a third semiconductor layer 38. In addition, a pitch means a distance for 1 period of a case where the columnar portions 30 are arranged periodically. In the illustrated example, the pitch is, for example, a distance between the centers of columnar portions 30 adjacent to each other.

The first semiconductor layer 32 is provided on the buffer layer 22. The first semiconductor layer 32 is provided between the substrate 10 and the light emitting layer 34. The first semiconductor layer 32 is, for example, an n-type semiconductor layer. The first semiconductor layer 32 is, for example, an n-type AlGaN layer doped with silicon. A thickness of the first semiconductor layer 32 is, for example, approximately 500 nm.

The first guide layer 33 is provided on the first semiconductor layer 32. The first guide layer 33 is provided between the first semiconductor layer 32 and the light emitting layer 34. The first guide layer 33 is, for example, an i-type semiconductor layer that is not doped with impurities. The first guide layer 33 is, for example, an i-type GaN layer, an i-type InGaN layer, or the like. The thickness of the first guide layer 33 is, for example, approximately 100 nm.

The light emitting layer 34 is provided on the first guide layer 33. The light emitting layer 34 is provided between the first semiconductor layer 32 and the second semiconductor layer 36. The light emitting layer 34 is provided between the first guide layer 33 and the second guide layer 35. The light emitting layer 34 is an i-type semiconductor layer. The light emitting layer 34 is a layer capable of generating light when a current is injected.

As illustrated in FIG. 2, the light emitting layer 34 includes a quantum well layer 340 and a barrier layer 342. The light emitting layer 34 has a multi quantum well (MQW) structure in which the quantum well layers 340 and the barrier layers 342 are alternately arranged. In the illustrated example, the light emitting layer 34 has a multiple quantum well structure in which three quantum well structures each configured with the quantum well layer 340 and the barrier layer 342 are stacked.

The quantum well layer 340 is, for example, an i-type InGaN layer. A concentration of indium in the quantum well layer 340 is higher than a concentration of indium in the barrier layer 342. The thickness of the quantum well layer 340 is, for example, approximately 3 nm.

The barrier layer 342 is, for example, an i-type GaN layer, an i-type InGaN layer, or the like. In a case where the barrier layer 342 is an InGaN layer, the concentration of indium in the barrier layer 342 is lower than the concentration of indium in the quantum well layer 340. A band gap of the barrier layer 342 is larger than a band gap of the quantum well layer 340. The barrier layer 342 has a function of confining carriers in the quantum well layer 340. The thickness of the barrier layer 342 is, for example, approximately 10 nm.

The second guide layer 35 is provided on the third semiconductor layer 38. The second guide layer 35 is provided between the third semiconductor layer 38 and the second semiconductor layer 36. The second guide layer 35 is provided between the light emitting layer 34 and the second semiconductor layer 36. The second guide layer 35 is, for example, an i-type semiconductor layer. The second guide layer 35 is, for example, an i-type GaN layer, an i-type InGaN layer, or the like. A thickness of the second guide layer 35 is, for example, approximately 100 nm.

A refractive index of the first guide layer 33 is higher than a refractive index of the first semiconductor layer 32 and a refractive index of the second semiconductor layer 36. In addition, a refractive index of the second guide layer 35 is higher than a refractive index of the first semiconductor layer 32 and a refractive index of the second semiconductor layer 36. The first guide layer 33 and the second guide layer 35 sandwich the light emitting layer 34. The first guide layer 33 and the second guide layer 35 have a function of confining light in the light emitting layer 34.

The second semiconductor layer 36 is provided on the second guide layer 35. The second semiconductor layer 36 is provided on the light emitting layer 34 via the second guide layer 35. The second semiconductor layer 36 is a layer having a conductivity type different from the first semiconductor layer 32. The second semiconductor layer 36 is, for example, a p-type semiconductor layer. The second semiconductor layer 36 is, for example, a p-type AlGaN layer doped with magnesium. The thickness of the second semiconductor layer 36 is, for example, 300 nm. The first semiconductor layer 32 and the second semiconductor layer 36 are cladding layers having a function of confining light in the light emitting layer 34.

The third semiconductor layer 38 is provided between the light emitting layer 34 and the second semiconductor layer 36 and on a side surface 34a of the light emitting layer 34. The third semiconductor layer 38 is, for example, a p-type semiconductor layer. The third semiconductor layer 38 is, for example, a p-type AlGaN layer doped with magnesium. An impurity concentration of the third semiconductor layer 38 is higher than an impurity concentration of the second semiconductor layer 36. A band gap of the third semiconductor layer 38 is larger than a band gap of the light emitting layer 34.

As illustrated in FIG. 2, the third semiconductor layer 38 includes a first part 38a between the light emitting layer 34 and the second semiconductor layer 36, and a second part 38b that is in contact with the side surface 34a of the light emitting layer 34.

In the illustrated example, the first part 38a is provided between the light emitting layer 34 and the second guide layer 35. The first part 38a is sandwiched between the upper surface of the light emitting layer 34 and the lower surface of the second guide layer 35. The first part 38a functions as an electron block layer that reduces leakage of electrons to the second semiconductor layer 36.

The second part 38b is in contact with the side surface 34a of the light emitting layer 34. The side surface 34a of the light emitting layer 34 is a surface in a direction orthogonal to the thickness direction of the light emitting layer 34. The second part 38b is further in contact with the side surface of the first guide layer 33. The second part 38b covers the side surface 34a of the light emitting layer 34. The second part 38b further covers the side surface of the first guide layer 33. The second part 38b is a part that is not sandwiched between the light emitting layer 34 and the second semiconductor layer 36.

A thickness D2 of the second part 38b is smaller than a thickness D1 of the first part 38a. The thickness D2 of the second part 38b is, for example, the maximum film thickness of the second part 38b, and the thickness D1 of the first part 38a is, for example, the maximum film thickness of the first part 38a. The thickness of the second part 38b is, for example, the size of the second part 38b along the perpendicular line of the side surface 34a of the light emitting layer 34. Further, the thickness of the first part 38a is the size of the first part 38a along the perpendicular line on the upper surface of the light emitting layer 34. The thickness D1 of the first part 38a is, for example, approximately 15 nm, and the thickness D2 of the second part 38b is, for example, approximately 5 nm.

Although not illustrated, the thickness of the second part 38b may decrease from the first part 38a toward the first semiconductor layer 32.

The third semiconductor layer 38 is not in contact with the first semiconductor layer 32, and the third semiconductor layer 38 and the first semiconductor layer 32 are separated from each other. In other words, the third semiconductor layer 38 does not cover the side surface of the first semiconductor layer 32. In the illustrated example, the third semiconductor layer 38 covers the entire side surface 34a of the light emitting layer 34 and a part of the side surface of the first guide layer 33.

The light propagation layer 40 is provided between the columnar portions 30 adjacent to each other. The light propagation layer 40 is provided on the mask layer 60. The light propagation layer 40 covers the side surface of the columnar portion 30. A refractive index of the light propagation layer 40 is lower than a refractive index of the columnar portion 30. The light propagation layer 40 is, for example, a GaN layer that is not doped with impurities. The light generated in the light emitting layer 34 can propagate through the light propagation layer 40 in a direction orthogonal to the lamination direction. The light propagation layer 40 is not limited to a GaN layer, and may be another insulating layer, such as an AlGaN layer or a silicon oxide layer. Further, in the embodiment, the refractive index of the light propagation layer 40 is lower than the refractive index of the columnar portion 30, but not limited thereto, and the refractive index of the light propagation layer 40 may be different from the refractive index of the columnar portion 30, and may be higher than the refractive index of the columnar portion 30.

The first electrode 50 is provided on the buffer layer 22. The buffer layer 22 may be in ohmic contact with the first electrode 50. The first electrode 50 is electrically coupled to the first semiconductor layer 32. In the illustrated example, the first electrode 50 is electrically coupled to the first semiconductor layer 32 via the buffer layer 22. The first electrode 50 is one electrode for injecting a current into the light emitting layer 34. As the first electrode 50, a member configured by laminating a Ti layer, an Al layer, and an Au layer in order from the buffer layer 22 side is used, for example. In a case where the substrate 10 is conductive, the first electrode 50 may be provided under the substrate 10 although not illustrated.

The second electrode 52 is provided on the side opposite to base 10 side of the laminated structure 20. In the illustrated example, the second electrode 52 is provided on the second semiconductor layer 36. The second semiconductor layer 36 may be in ohmic contact with the second electrode 52. The second electrode 52 is electrically coupled to the second semiconductor layer 36. The second electrode 52 is the other electrode for injecting a current into the light emitting layer 34. As the second electrode 52, for example, indium tin oxide (ITO) is used.

In the light emitting device 100, the p-type second semiconductor layer 36, the light emitting layer 34, and the n-type first semiconductor layer 32 configure a pin diode. In the light emitting device 100, when a forward bias voltage of the pin diode is applied between the first electrode 50 and the second electrode 52, a current is injected into the light emitting layer 34, and recombination of an electron and a positive hole occurs on the light emitting layer 34. The recombination causes light emission. The light generated in the light emitting layer 34 propagates through the light propagation layer 40 in the direction orthogonal to the lamination direction by the first semiconductor layer 32 and the second semiconductor layer 36, a standing wave is formed by the effect of the photonic crystal by the plurality of columnar portions 30, and laser oscillation occurs by receiving a gain in the light emitting layer 34. Then, the light emitting device 100 emits +first order diffracted light and −first order diffracted light as laser light in the lamination direction.

Although not illustrated, a reflective layer may be provided between the substrate 10 and the buffer layer 22 or below the substrate 10. The reflective layer is, for example, a distributed bragg reflector (DBR) layer. The light generated in the light emitting layer 34 can be reflected by the reflective layer, and the light emitting device 100 can emit light only from the second electrode 52 side.

For example, the light emitting device 100 has the following characteristics.

The light emitting device 100 includes the third semiconductor layer 38 having a band gap larger than that of the light emitting layer 34, and the third semiconductor layer 38 includes the first part 38a provided between the light emitting layer 34 and the second semiconductor layer 36 and a second part 38b that is in contact with the side surface 34a of the light emitting layer 34. In this manner, in the light emitting device 100, the side surface 34a of the light emitting layer 34 is covered with the second part 38b of the third semiconductor layer 38 having a band gap larger than that of the light emitting layer 34, and thus, surface recombination can be reduced on the side surface 34a of the light emitting layer 34. Therefore, the light emitting device 100 can have high light emission efficiency.

Further, in the light emitting device 100, since the first part 38a of the third semiconductor layer 38 functions as an electron block layer, leakage of electrons to the second semiconductor layer 36 can be reduced.

In this manner, in the light emitting device 100, since the third semiconductor layer 38 has a function as an electron blocking layer and a function of reducing surface recombination, high light emission efficiency can be obtained with a simple configuration.

In the light emitting device 100, since the impurity concentration of the third semiconductor layer 38 is higher than the impurity concentration of the second semiconductor layer 36, leakage of electrons to the second semiconductor layer 36 can be more reliably reduced.

In the light emitting device 100, the thickness D2 of the second part 38b is smaller than the thickness D1 of the first part 38a. Therefore, the resistance of the second part 38b can be increased. Therefore, in the light emitting device 100, a possibility that the first semiconductor layer 32 and the second semiconductor layer 36 are short-circuited via the third semiconductor layer 38 can be reduced, and the yield can be improved.

In the light emitting device 100, the first part 38a is provided between the light emitting layer 34 and the second guide layer 35. Therefore, for example, the distance between the light emitting layer 34 and the first part 38a can be reduced compared to a case where the first part 38a is provided between the second guide layer 35 and the second semiconductor layer 36. Accordingly, the leakage of electrons to the second semiconductor layer 36 can be efficiently reduced.

In the light emitting device 100, the third semiconductor layer 38 is not in contact with the first semiconductor layer 32. Therefore, the first semiconductor layer 32 and the second semiconductor layer 36 can be prevented from being short-circuited via the third semiconductor layer 38.

In the description above, a case where the third semiconductor layer 38 is not in contact with the first semiconductor layer 32 has been described, but when the resistance of the second part 38b of the third semiconductor layer 38 is substantially large to prevent the first semiconductor layer 32 and the second semiconductor layer 36 from being short-circuited, the third semiconductor layer 38 may be in contact with the first semiconductor layer 32. For example, the resistance of the second part 38b can be increased by reducing the thickness of the second part 38b. Further, as will be described in a first modification example described later, the resistance of the second part 38b can be increased by reducing the impurity concentration of the second part 38b. In addition, the resistance of the second part 38b may be increased by reducing the thickness of the second part 38b and decreasing the impurity concentration of the second part 38b.

1.2. Manufacturing Method of Light Emitting Device

Figure 3:
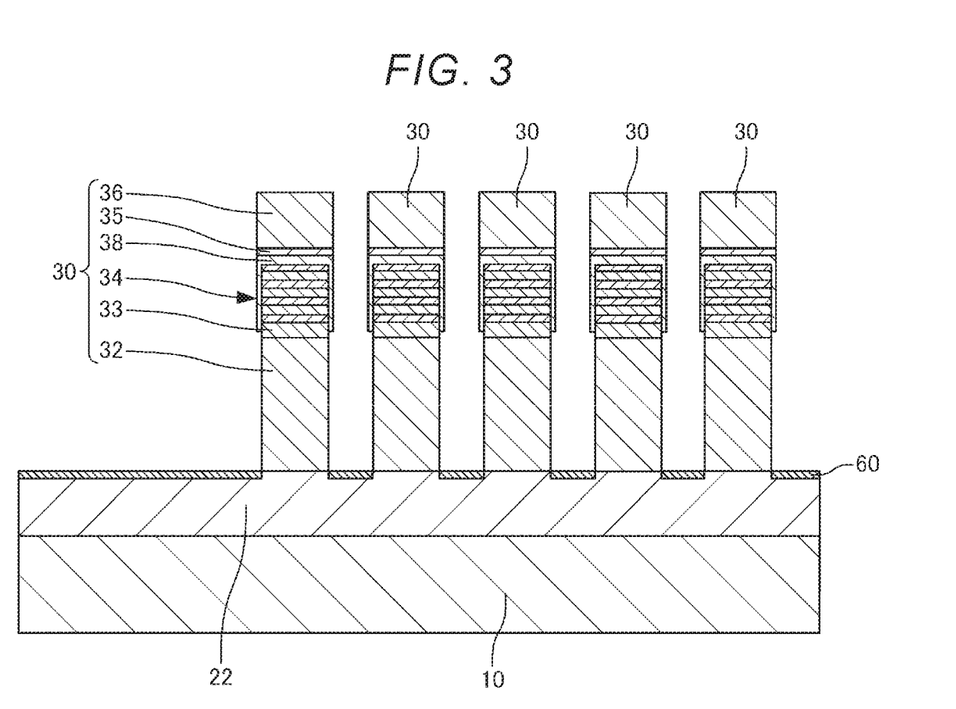
FIG. 3 is a sectional view schematically illustrating a manufacturing process of the light emitting device according to the first embodiment.

Next, a manufacturing method of the light emitting device 100 will be described with reference to the drawings. FIG. 3 is a sectional view schematically illustrating the manufacturing process of the light emitting device 100.

As illustrated in FIG. 3, the buffer layer 22 is epitaxially grown on the substrate 10. Examples of the epitaxial growth method include a metal organic chemical vapor deposition (MOCVD) method, a molecular beam epitaxy (MBE) method, and the like.

Next, the mask layer 60 is formed on the buffer layer 22. The mask layer 60 is formed by, for example, film formation by an electron beam vapor deposition method or a plasma chemical vapor deposition (CVD) method, and patterning by a photolithography technique and an etching technique.

Next, the first semiconductor layer 32, the first guide layer 33, the light emitting layer 34, the third semiconductor layer 38, the second guide layer 35, and the second semiconductor layer 36 are epitaxially grown on the buffer layer 22 using the mask layer 60 as a mask. Examples of the epitaxial growth method include an MOCVD method and an MBE method.

Here, when the third semiconductor layer 38 is epitaxially grown, the third semiconductor layer 38 can be grown in a direction orthogonal to the lamination direction by controlling the growth conditions of the third semiconductor layer 38. Accordingly, the first part 38a and the second part 38b of the third semiconductor layer 38 can be formed. The growth conditions include the growth temperature, the supply amount of gallium and nitrogen, the pressure of the source gas, and the like. Further, when the distance between the columnar portions 30 adjacent to each other is small, the material supplied to the side surface of the columnar portion 30 decreases, and the growth on the side surface of the columnar portion 30 is suppressed. Using this effect, the thickness D2 of the second part 38b may be smaller than the thickness D1 of the first part 38a.

The columnar portion 30 can be formed by the process above.

As illustrated in FIG. 1, a light propagation layer 40 is formed between the columnar portions 30 adjacent to each other. The light propagation layer 40 is formed by, for example, the MOCVD method, the spin coating method, or the like.

Next, the first electrode 50 is formed on the buffer layer 22, and the second electrode 52 is formed on the second semiconductor layer 36. The first electrode 50 and the second electrode 52 are formed by, for example, a vacuum evaporation method. An order of forming the first electrode 50 and the second electrode 52 is not particularly limited.

Through the above steps, the light emitting device 100 can be manufactured.

1.3. Modification Example

Next, a modification example of the light emitting device 100 according to the first embodiment will be described. In each modification example described below, members having the same functions as those of the above-described light emitting device 100 will be given the same reference numerals, and the detailed description thereof will be omitted.

1.3.1. First Modification Example

Figure 4:
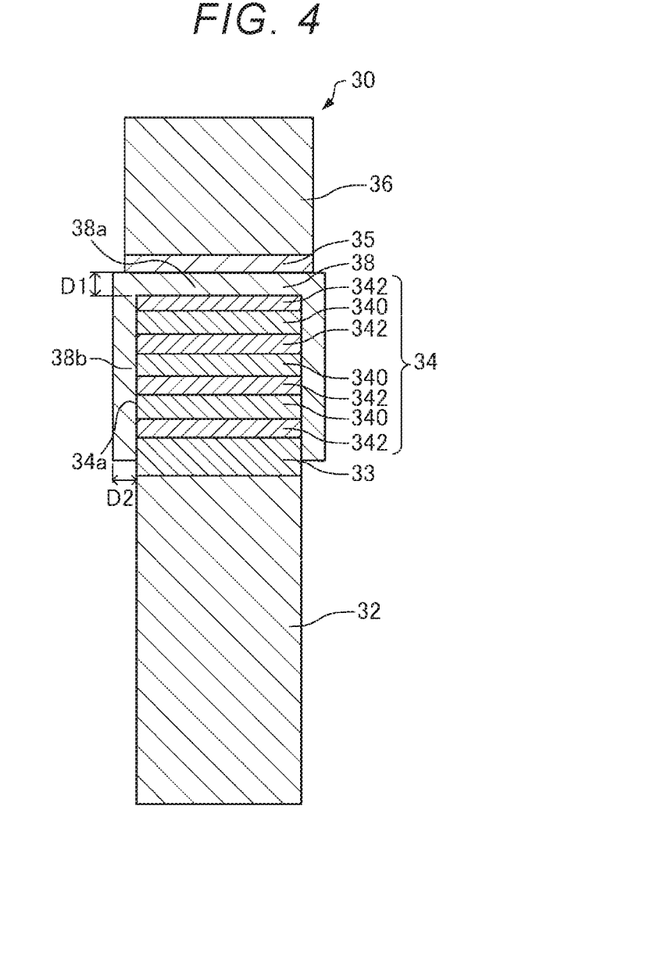
FIG. 4 is a sectional view schematically illustrating a columnar portion of a light emitting device according to a first modification example.

FIG. 4 is a sectional view schematically illustrating the columnar portion 30 of the light emitting device according to a first modification example.

In the above-described light emitting device 100, as illustrated in FIG. 2, the thickness D2 of the second part 38b is made smaller than the thickness D1 of the first part 38a to increase the resistance of the second part 38b.

On the other hand, in the light emitting device according to the first modification example, the impurity concentration of the second part 38b is lower than the impurity concentration of the first part 38a to increase the resistance of the second part 38b. Therefore, in the light emitting device according to the first modification example, similar to the above-described light emitting device 100, a possibility that the first semiconductor layer 32 and the second semiconductor layer 36 are short-circuited via the third semiconductor layer 38 can be reduced, and the yield can be improved. A thickness D2 of the second part 38b is, for example, the same as the thickness D1 of the first part 38a.

The impurity concentration of the first part 38a and the impurity concentration of the second part 38b can be controlled by, for example, the growth conditions when the third semiconductor layer 38 is epitaxially grown.

1.3.2. Second Modification Example

Figure 5:
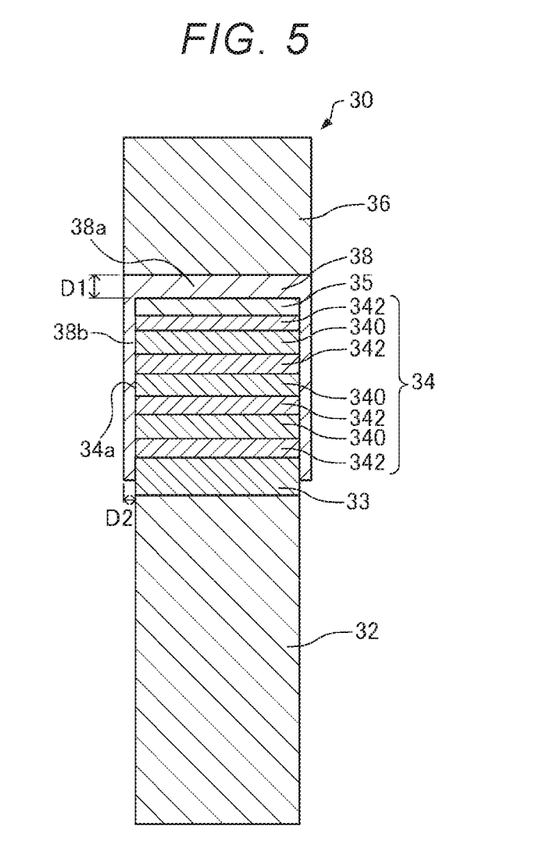
FIG. 5 is a sectional view schematically illustrating a columnar portion of a light emitting device according to a second modification example.

FIG. 5 is a sectional view schematically illustrating the columnar portion 30 of the light emitting device according to a second modification example.

In the above-described light emitting device 100, as illustrated in FIG. 2, the first part 38a is provided between the light emitting layer 34 and the second guide layer 35. On the other hand, in the light emitting device according to the second modification example, as illustrated in FIG. 5, the first part 38a is provided between the second guide layer 35 and the second semiconductor layer 36.

The second guide layer 35 is provided on the light emitting layer 34. The second guide layer 35 is provided between the light emitting layer 34 and the second semiconductor layer 36. In the illustrated example, the second guide layer 35 is provided between the light emitting layer 34 and the third semiconductor layer 38.

The first part 38a is sandwiched between the upper surface of the second guide layer 35 and the lower surface of the second semiconductor layer 36. The second part 38b is in contact with the side surface 34a of the light emitting layer 34. The second part 38b is further in contact with the side surface of the second guide layer 35 and a part of the side surface of the first guide layer 33. The second part 38b covers the entire side surface of the second guide layer 35, the entire side surface 34a of the light emitting layer 34, and a part of the side surface of the first guide layer 33.

In the light emitting device according to the second modification example, the first part 38a is provided between the second guide layer 35 and the second semiconductor layer 36. Therefore, for example, the distance between the light emitting layer 34 and the first part 38a can be reduced compared to a case where the first part 38a is provided between the light emitting layer 34 and the second guide layer 35. Therefore, in the light emitting device according to the second modification example, the loss of light propagating through the light emitting layer 34 can be reduced.

1.3.3. Third Modification Example

Figure 6:
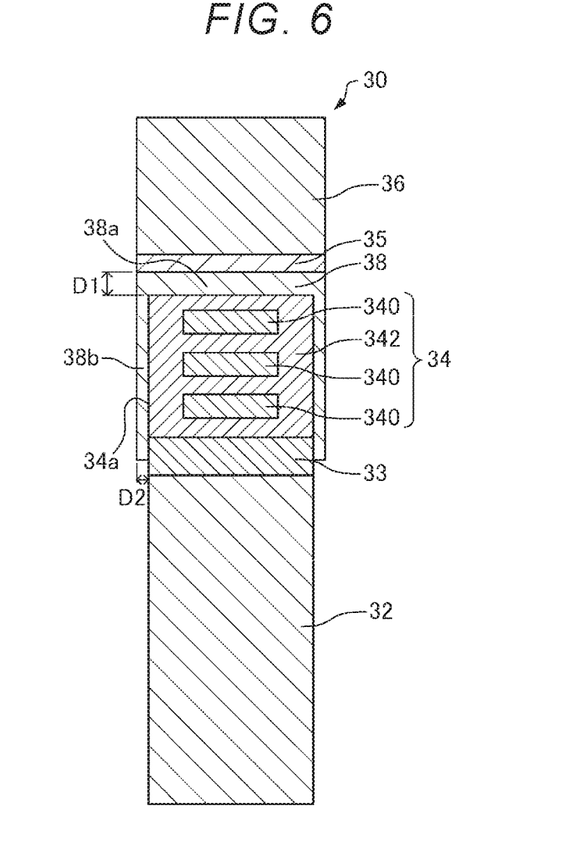
FIG. 6 is a sectional view schematically illustrating a columnar portion of a light emitting device according to a third modification example.

FIG. 6 is a sectional view schematically illustrating the columnar portion 30 of the light emitting device according to a third modification example.

In the above-described light emitting device 100, as illustrated in FIG. 2, the quantum well layers 340 and the barrier layers 342 are alternately arranged in the light emitting layer 34.

On the other hand, in the light emitting device according to the third modification example, in the light emitting layer 34, the quantum well layer 340 is positioned at the center portion of the columnar portion 30, and the quantum well layer 340 is covered with the barrier layer 342. The barrier layer 342 surrounds the quantum well layer 340. The three quantum well layers 340 overlap each other when viewed from the lamination direction.

In the light emitting device according to the third modification example, the side surface of the quantum well layer 340 is double-covered with the barrier layer 342 and the third semiconductor layer 38. Here, the barrier layer 342 and the third semiconductor layer 38 have a band gap larger than that of the quantum well layer 340. Therefore, carriers can be confined in the center portion of the columnar portion 30, and surface recombination on the side surface 34a of the light emitting layer 34 can be reduced.

Figure 7:
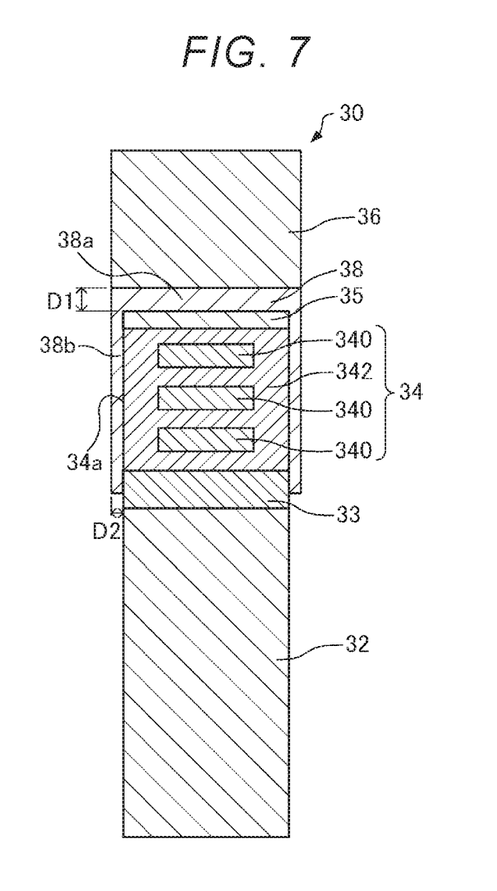
FIG. 7 is a sectional view schematically illustrating the columnar portion of the light emitting device according to the third modification example.

In the example illustrated in FIG. 6, the first part 38a is provided between the light emitting layer 34 and the second guide layer 35, but as illustrated in FIG. 7, the first part 38a may be provided between the second guide layer 35 and the second semiconductor layer 36.

2. Second Embodiment

2.1. Light Emitting Device

Figure 8:
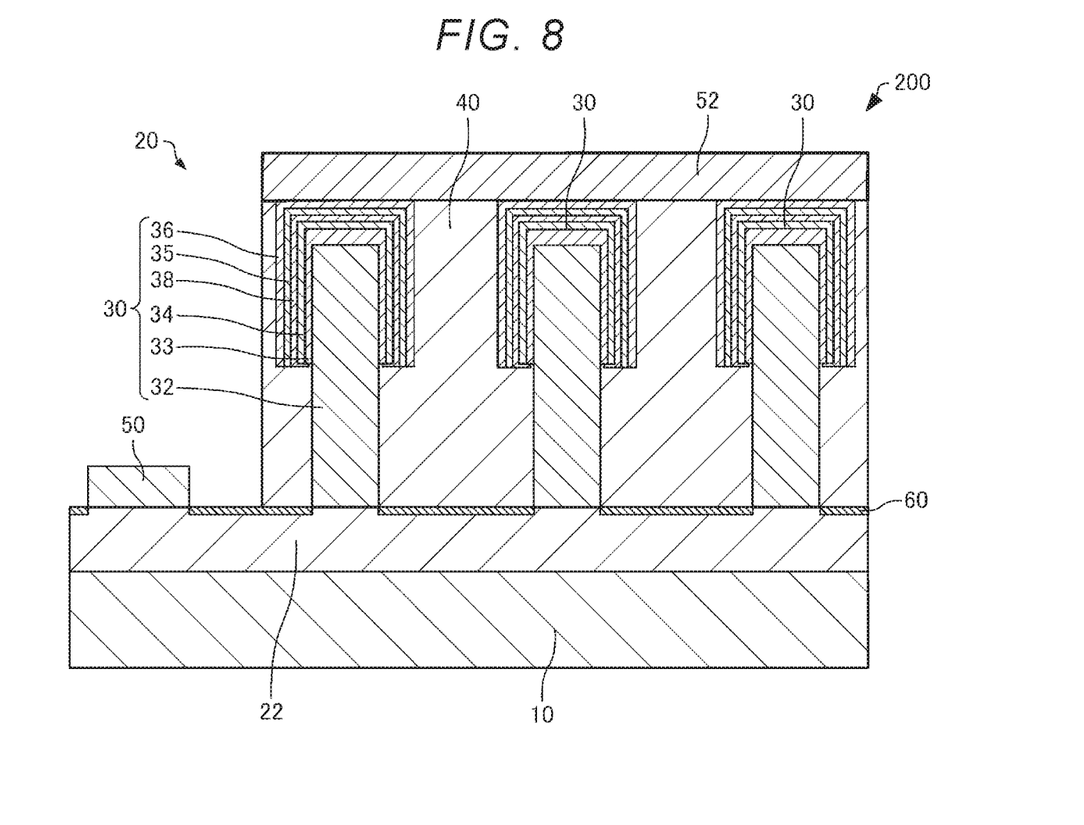
FIG. 8 is a sectional view schematically illustrating a light emitting device according to a second embodiment.
Figure 9:
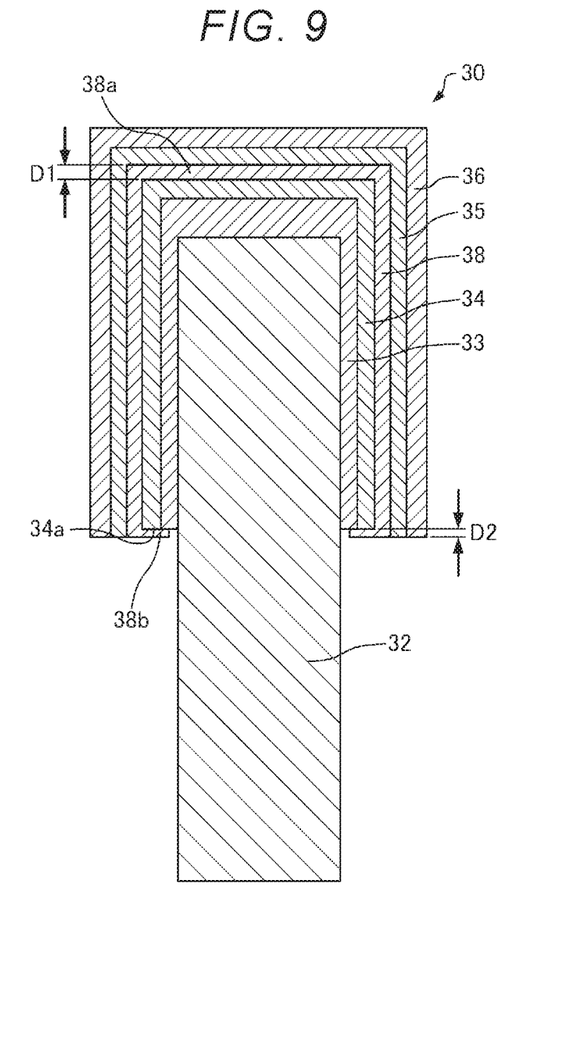
FIG. 9 is a sectional view schematically illustrating a columnar portion of the light emitting device according to the second embodiment.

Next, a light emitting device according to a second embodiment will be described with reference to the drawings. FIG. 8 is a sectional view schematically illustrating a light emitting device 200 according to the second embodiment. FIG. 9 is a sectional view schematically illustrating the columnar portion 30 of the light emitting device 200 according to the second embodiment. Hereinafter, in the light emitting device 200 according to the second embodiment, members having the same functions as those of the configuration members of the light emitting device 100 according to the above-described first embodiment will be given the same reference numerals, and the detailed description thereof will be omitted.

In the light emitting device 200 according to the second embodiment, as illustrated in FIGS. 8 and 9, the columnar first semiconductor layer 32 covers the first guide layer 33, the light emitting layer 34, the third semiconductor layer 38, the second guide layer 35, and the second semiconductor layer 36. In other words, the columnar portion 30 has a core shell structure in which the first semiconductor layer 32 is a core and the first guide layer 33, the light emitting layer 34, the third semiconductor layer 38, the second guide layer 35, and the second semiconductor layer 36 are shells.

As illustrated in FIG. 9, the third semiconductor layer 38 includes the first part 38a and the second part 38b. The second part 38b is in contact with the side surface 34a of the light emitting layer 34. The second part 38b is not sandwiched between the light emitting layer 34 and the second semiconductor layer 36.

Similar to the above-described light emitting device 100, the light emitting device 200 includes the third semiconductor layer 38 having the band gap larger than that of the light emitting layer 34, and the third semiconductor layer 38 includes the first part 38a provided between the light emitting layer 34 and the second semiconductor layer 36 and a second part 38b that is in contact with the side surface 34a of the light emitting layer 34. Therefore, in the light emitting device 200, surface recombination on the side surface 34a of the light emitting layer 34 can be reduced, and high light emission efficiency can be achieved.

In the description above, a case where the third semiconductor layer 38 is not in contact with the first semiconductor layer 32 has been described, but when the resistance of the second part 38b of the third semiconductor layer 38 is substantially large to prevent the first semiconductor layer 32 and the second semiconductor layer 36 from being short-circuited, the third semiconductor layer 38 may be in contact with the first semiconductor layer 32. For example, the resistance of the second part 38b may be increased by reducing the thickness of the second part 38b. Further, the resistance of the second part 38b may be increased by reducing the impurity concentration of the second part 38b. In addition, the resistance of the second part 38b may be increased by reducing the thickness of the second part 38b and decreasing the impurity concentration of the second part 38b.

2.2. Manufacturing Method of Light Emitting Device

The manufacturing method of the light emitting device 200 controls growth conditions when epitaxially growing the first guide layer 33, the light emitting layer 34, the third semiconductor layer 38, the second guide layer 35, and the second semiconductor layer 36, and except for the point that the layers are formed so as to cover the first semiconductor layer 32, the method is the same as the above-described manufacturing method of the light emitting device 100, and the description thereof will be omitted.

2.3. Modification Example

The first modification example and the second modification example of the light emitting device 100 according to the above-described first embodiment can also be applied to the light emitting device 200 according to the second embodiment.

3. Third Embodiment

Figure 10:
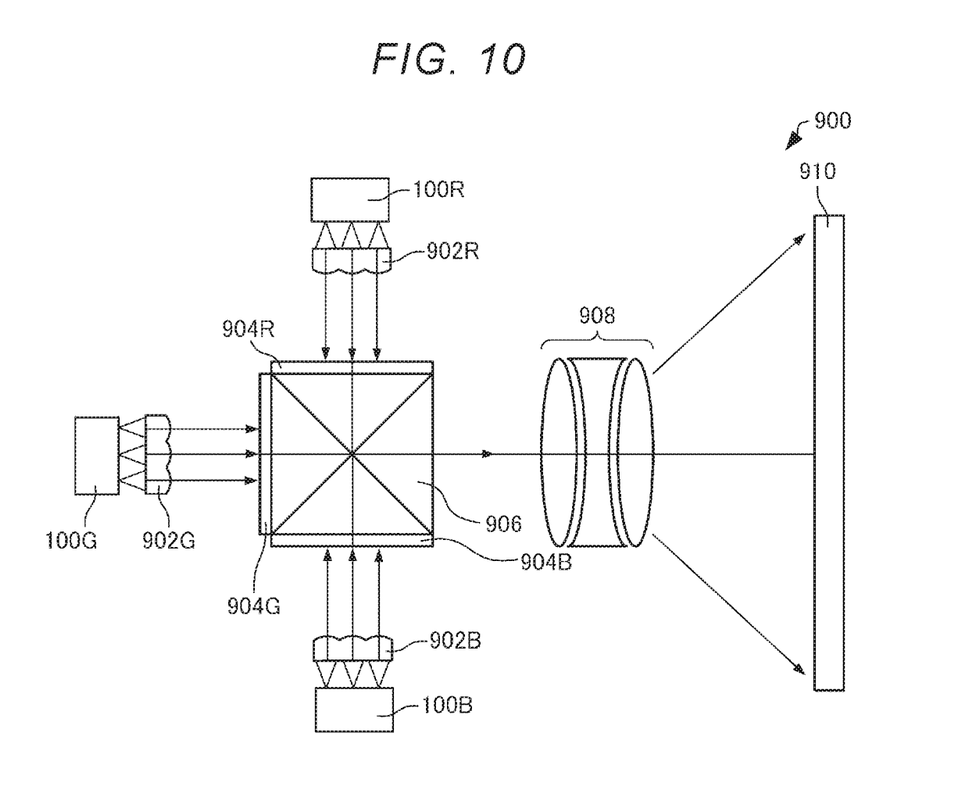
FIG. 10 is a view schematically illustrating a projector according to a third embodiment.

Next, a projector according to a third embodiment will be described with reference to the drawings. FIG. 10 is a view schematically illustrating a projector 900 according to the third embodiment.

The projector 900 includes the light emitting device 100 as a light source, for example.

The projector 900 includes a housing (not illustrated) and a red light source 100R, a green light source 100G, and a blue light source 100B that are provided in the housing and respectively emit red light, green light, and blue light. For convenience, in FIG. 10, the red light source 100R, the green light source 100G, and the blue light source 100B are simplified.

The projector 900 further includes a first lens array 902R, a second lens array 902G, a third lens array 902B, a first light modulation device 904R, a second light modulation device 904G, a third light modulation device 904B, and a projection device 908 that are provided in the housing. The first light modulation device 904R, the second light modulation device 904G, and the third light modulation device 904B are, for example, transmissive liquid crystal light valves. The projection device 908 is, for example, a projection lens.

The light emitted from the red light source 100R is incident on the first lens array 902R. The light emitted from the red light source 100R can be condensed by the first lens array 902R, for example, superimposed.

The light condensed by the first lens array 902R is incident on the first light modulation device 904R. The first light modulation device 904R modulates the incident light in accordance with image information. Then, the projection device 908 enlarges and projects the image formed by the first light modulation device 904R onto a screen 910.

The light emitted from the green light source 100G is incident on the second lens array 902G. The light emitted from the green light source 100G can be condensed by the second lens array 902G, for example, superimposed.

The light condensed by the second lens array 902G is incident on the second light modulation device 904G. The second light modulation device 904G modulates the incident light in accordance with image information. Then, the projection device 908 enlarges and projects the image formed by the second light modulation device 904G onto the screen 910.

The light emitted from the blue light source 100B is incident on the third lens array 902B. The light emitted from the blue light source 100B can be condensed by the third lens array 902B, for example, superimposed.

The light condensed by the third lens array 902B is incident on the third light modulation device 904B. The third light modulation device 904B modulates the incident light in accordance with image information. Then, the projection device 908 enlarges and projects the image formed by the third light modulation device 904B onto the screen 910.

Further, the projector 900 can include a cross dichroic prism 906 that combines the light emitted from the first light modulation device 904R, the second light modulation device 904G, and the third light modulation device 904B and guides the light to the projection device 908.

The three rays of color light modulated by the first light modulation device 904R, the second light modulation device 904G, and the third light modulation device 904B are incident on the cross dichroic prism 906. The cross dichroic prism 906 is formed by bonding four right angle prisms, and a dielectric multilayer film that reflects red light and a dielectric multilayer film that reflects blue light are arranged in a cross shape on the inner surface thereof. The dielectric multilayer films combine the three rays of color light to form light that represents a color image. The combined light is projected onto the screen 910 by the projection device 908, and an enlarged image is displayed.

In addition, the red light source 100R, the green light source 100G, and the blue light source 100B control the light emitting device 100 as video pixels in accordance with image information, and accordingly, a video may be directly formed without using the first light modulation device 904R, the second light modulation device 904G, and the third light modulation device 904B. Then, the projection device 908 may enlarge and project the video formed by the red light source 100R, the green light source 100G, and the blue light source 100B onto the screen 910.

In the above-described example, a transmissive liquid crystal light valve is used as the light modulation device, but a light valve other than liquid crystal may be used, or a reflective light valve may be used. Examples of such a light valve include a reflective liquid crystal light valve and a digital micro mirror device. Further, the configuration of the projection device is appropriately changed depending on the type of light valve used.

Further, the light source can also be applied to the light source device of the scanning type image display device including scanning means which is an image forming device for displaying an image of a desired size on a display surface by scanning the light from the light source on the screen.

The light emitting device according to the above-described embodiment can be used in addition to the projector. Applications other than the projector include light sources, such as indoor/outdoor lighting, display backlights, laser printers, scanners, in-vehicle lights, sensing devices using light, and communication devices.

In addition, the present disclosure is not limited to above-described embodiments, various modifications are possible within the range of the summary of the present disclosure.

For example, in the light emitting device 100 according to the above-described first embodiment, the InGaN-based light emitting layer 34 has been described, but various material systems that can emit light when a current is injected in accordance with a wavelength of the emitted light can be used as the light emitting layer 34. For example, semiconductor materials, such as AlGaN, AlGaAs, InGaAs, InGaAsP, InP, GaP, and AlGaP, can be used. The same applies to the light emitting device 200 according to the second embodiment, and various material systems that can emit light when a current is injected in accordance with the wavelength of emitted light can be used as the light emitting layer 34.

In the above-described light emitting device 100 according to the first embodiment, the third semiconductor layer 38 in which the first part 38a and the second part 38b are continuously formed has been described, but the present disclosure is not limited thereto, and the first part 38a and the second part 38b may not be continuous and may be separated from each other.

In the present disclosure, a part of the configuration may be omitted within a range having the characteristics and effects described in the application, or each embodiment or modification examples may be combined.

The present disclosure is not limited to the above-described embodiments, and various modifications can be made. For example, the present disclosure includes substantially the same configuration as that described in the embodiments. The substantially same configuration is, for example, a configuration having the same function, method, and result, or a configuration having the same purpose and effect. In addition, the present disclosure includes a configuration in which a non-essential part of the configuration described in the embodiments is replaced. In addition, the present disclosure includes a configuration that exhibits the same operational effects as those of the configuration described in the embodiment or a configuration that can achieve the same purpose. In addition, the present disclosure includes a configuration in which a known technique is added to the configuration described in the embodiments.

What is claimed is:

1. A light emitting device comprising:
a substrate;
a laminated structure provided on the substrate and having a plurality of columnar portions,
wherein the columnar portion includes
an n-type first semiconductor layer,
a p-type second semiconductor layer,
a light emitting layer provided between the first semiconductor layer and the second semiconductor layer, and
a third semiconductor layer having a band gap larger than that of the light emitting layer, and
the third semiconductor layer includes
a first part provided between the light emitting layer and the second semiconductor layer, and
a second part that is in contact with a side surface of the light emitting layer, wherein an impurity concentration of the second part is lower than an impurity concentration of the first part.

2. The light emitting device according to claim 1, wherein the third semiconductor layer is a p-type semiconductor layer, and
an impurity concentration of the third semiconductor layer is higher than an impurity concentration of the second semiconductor layer.

3. The light emitting device according to claim 1, wherein a thickness of the second part is less than a thickness of the first part.

4. A light emitting device comprising
a substrate;
a laminated structure provided on the substrate and having a plurality of columnar portions,
wherein the columnar portion includes
an n-type first semiconductor layer,
a p-type second semiconductor layer,
a light emitting layer provided between the first semiconductor layer and the second semiconductor layer, and
a third semiconductor layer having a band gap larger than that of the light emitting layer, and
the third semiconductor layer includes
a first part provided between the light emitting layer and the second semiconductor layer, and
a second part that is in contact with a side surface of the light emitting layer, wherein
the columnar portion has a first guide layer and a second guide layer sandwiching the light emitting layer,
the second guide layer is provided between the light emitting layer and the second semiconductor layer, and
the first part is provided between the light emitting layer and the second guide layer.

5. A light emitting device comprising:
a substrate;
a laminated structure provided on the substrate and having a plurality of columnar portions,
wherein the columnar portion includes
an n-type first semiconductor layer;
a p-type second semiconductor layer,
a light emitting layer provided between the first semiconductor layer and the second semiconductor layer, and
a third semiconductor layer having a band gap larger than that of the light emitting layer, and
the third semiconductor layer includes
a first part provided between the light emitting layer and the second semiconductor layer, and
a second part that is in contact with a side surface of the light emitting layer, wherein
the columnar portion has a first guide layer and a second guide layer sandwiching the light emitting layer, the second guide layer is provided between the light emitting layer and the second semiconductor layer, and the first part is provided between the second guide layer and the second semiconductor layer.

6. The light emitting device according to claim 1, wherein the third semiconductor layer is not in contact with the first semiconductor layer.

7. A projector comprising:
the light emitting device according to claim 1.

8. A light emitting device comprising:
a substrate;
a laminated structure provided on the substrate and having a plurality of columnar portions, wherein
the columnar portion includes
    an n-type first semiconductor layer,
    a p-type second semiconductor layer,
    a light emitting layer provided between the first semiconductor layer and the second semiconductor layer, and
    a third semiconductor layer having a band gap larger than that of the light emitting layer,
the third semiconductor layer includes
    a first part sandwiched between the light emitting layer and the second semiconductor layer, and
    a second part not sandwiched between the light emitting layer and the second semiconductor layer, the second part being in contact with a side surface of the light emitting layer.

\* \* \* \* \*